United States Patent [19]

Needles et al.

[11] Patent Number: 4,851,716
[45] Date of Patent: Jul. 25, 1989

[54] SINGLE PLANE DYNAMIC DECODER

[75] Inventors: William M. Needles; Paul J. Patchen, both of Arlington, Tex.

[73] Assignee: National Semiconductor Corporation, Santa Clara, Calif.

[21] Appl. No.: 204,637

[22] Filed: Jun. 9, 1988

[51] Int. Cl.[4] .................. H03K 19/017; H03K 19/094
[52] U.S. Cl. ..................................... 307/463; 307/449; 307/443; 365/231
[58] Field of Search ............... 307/463, 449, 468, 469, 307/450, 270; 365/230, 231, 177

[56] References Cited

U.S. PATENT DOCUMENTS

| | | | |
|---|---|---|---|
| 4,292,547 | 9/1981 | Pfiester et al. | 307/463 |
| 4,620,116 | 10/1986 | Ozawa | 307/449 |
| 4,725,742 | 2/1988 | Tachimori et al. | 307/463 X |
| 4,730,133 | 3/1988 | Yoshida | 307/463 X |
| 4,777,390 | 10/1988 | Hoshi | 307/463 X |

Primary Examiner—John S. Heyman
Assistant Examiner—David R. Bertelson
Attorney, Agent, or Firm—Limbach, Limbach & Sutton

[57] ABSTRACT

A single plane dynamic decoder wherein a typical decoder row comprises a P-channel transistor connected between a positive supply and a first node, a second N-channel transistor connected between ground potential and a second node, and a plurality of series-connected devices connected between the first node and the second node. The gates of the intermediate N-channel devices are connected to a corresponding input signal such that the intermediate devices are enabled or disabled depending on the state of the associated input. The gate of the P-channel device is connected to a clock signal such that it is enabled by a first clock phase and disabled by a second clock phase. The N-channel device is connected to the clock signal such that it is enabled by the second clock phase and disabled by the first clock phase. Thus, the first node is precharged when the P-channel device is enabled. This precharge activity occurs serially and hierarchically down the row depending on the state of the respective input signals. When the clock state changes, the N-channel device is enabled and the second node is discharged. The discharging of nodes will propagate serially up the row depending upon the state of the input signals. Therefore, the intermediate devices provide a NAND function. If each of the first nodes of adjacent rows are connected to a single output node, a wired-OR function results. Thus, a multi-term single plane dynamic decoder is provided that has the same functionality as a conventional two-plane AND-OR functional array or a static logic array.

5 Claims, 2 Drawing Sheets

OUT = AB + CDE + FGHI

SINGLE PLANE DYNAMIC DECODER

BACKGROUND OF THE INVENTION

1. Field of the Invention

The present invention relates to a high speed single plane dynamic decoder which may be easily programmed by adding or deleting series terms.

2. Background of the Invention

A logic array can be implemented in a variety of ways. Typically, the required logic equation is reduced to as close to minimum complexity as possible and then the actual circuit logic to implement the equation is selected. Classically, the circuitry used is multi-input NAND, NOR or complex gates connected to achieve the desired logic result.

There are a number of drawbacks to the classic approach. The logic is usually cumbersome to lay out on an integrated circuit chip since each logic gate is typically different in size, making packing difficult. In addition, the interconnects between logic elements become very extensive when logic levels grow in size. Also, after packing the logic, any design changes required to be made in the logic circuit are difficult to implement at best and often the entire layout must be redone. Furthermore, the actual silicon area required to hold the logic array can become quite large, thus increasing costs and decreasing yield. An additional problem is that propagation delays through the static array increase with each logic level and can become quite large when the logic required is complex.

The speed through the decorder is of utmost importance when designing a high speed processor or controller that must decode instructions or control lines.

FIG. 1 shows a classic NAND-NAND static decoder. The transistor count of this static approach is 24 total CMOS transistors.

SUMMARY TO THE INVENTION

The present invention provides a single plane dynamic decoder for applying a logical expression to a plurality of input signals to produce an "on" or "off" state at defined output nodes. The decoder comprises a number of rows of series-connected MOSFET transistors. According to a preferred embodiment of the invention, a typical row comprises a P-channel MOSFET transistor connected between a positive potential and a first node. An N-channel MOSFET transistor is connected between ground potential and a second node. A plurality of series-connected N-channel MOSFET devices are connected between the first node and the second node, defining additional nodes at their respective interconnections. The gates of these intermediate N-channel devices are connected to a corresponding input signal such that these devices are enabled or disabled depending upon the state of their associated input signal. The gate of the P-channel transistor is connected to a clock signal such that it is enabled by a first clock phase and disabled by the second clock phase. The N-channel transistor is also connected to the clock signal such that it is enabled by the second clock phase and disabled by the first clock phase. Thus, the first node is precharged to the "on" state when the P-channel transistor is enabled. This precharge activity will also occur serially and hierarchically down the row from the first node depending upon the state of the respective input signals to the intermediate N-channel transistors. When the clock changes state, the N-channel device is enabled and the second node is discharged to the "off" state. The discharging of nodes will propagate serially up the row from the second node depending upon the state of the input signals to the intermediate devices. Therefore, the intermediate devices provide a NAND function. If the first nodes of adjacent rows are connected to a single output node, a wired-OR function results. Thus, the present invention provides a single plane dynamic decoder that has the same functionality as a conventional two-plane AND-OR functional array or static logic gate decoder.

Other advantages and features of the present invention will be better understood and appreciated by reference to the detailed description of the invention provided below which should be considered in conjunction with the accompanying drawings.

DETAILED DESCRIPTION OF THE INVENTION

A single plane dynamic decoder in accordance with the present invention comprises a combination of seies-connected P-channel and N-channel devices. The primary function of these devices is to apply a logical expression to a given set of signal inputs and produce an "on" or "off" state at each of the defined outputs.

Figure 2:
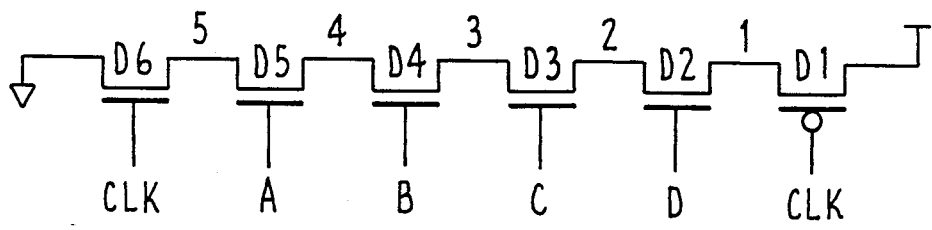
FIG. 2 is a simple schematic diagram illustrating a single row of a dynamic decoder architecture in accordance with the present invention.

FIG. 2 illustrates a single row of a typical dynamic decoder architecture in accordance with the present invention. P-channel device D1 and N-channel device D6 are utilized for precharging and discharging, respectively, as described below. These two devices are clocked from the same source CLK, but operate exactly out of phase. When CLK is low, P-channel device D1 is activated and actively precharges node 1 to the system VCC voltage level while device D6 remains inactive. Nodes 2, 3, 4 and 5 are also precharged, depending on the state of signals A, B, C and D. That is, intermediate nodes 2 through 5 are controlled by intermediate N-channel devices D2–D5, respectively, the gates of which are connected to receive the A-D input signals, respectively. This precharging activity is serial and hierarchical since node 1 precedes node 2 and so on.

After an appropriate period of time has elapsed, the system CLK changes state and N-channel device D6 becomes active while P-channel device D1 is disabled. Node 5 is actively discharged to system ground voltage level, while node 1 changes to a capacitive charge level. This discharging of nodes continues its propagation serially up the row, hierarchically dependent on the states of input signals A, B, C and D to the intermediate devices D2–D5. For example, if gate D5 is active because input signal A is active, then node 4 will be discharged. However, if the gate of device D5 is inactive during the discharge phase, then nodes 1 through 4 will not be discharged and will retain their values from the previous clock phase. Therefore, devices D2 through D6 operate as a NAND function and only return an active low output at node 1 if all four devices D2 through D5 are active during the discharge stage.

Figure 1:
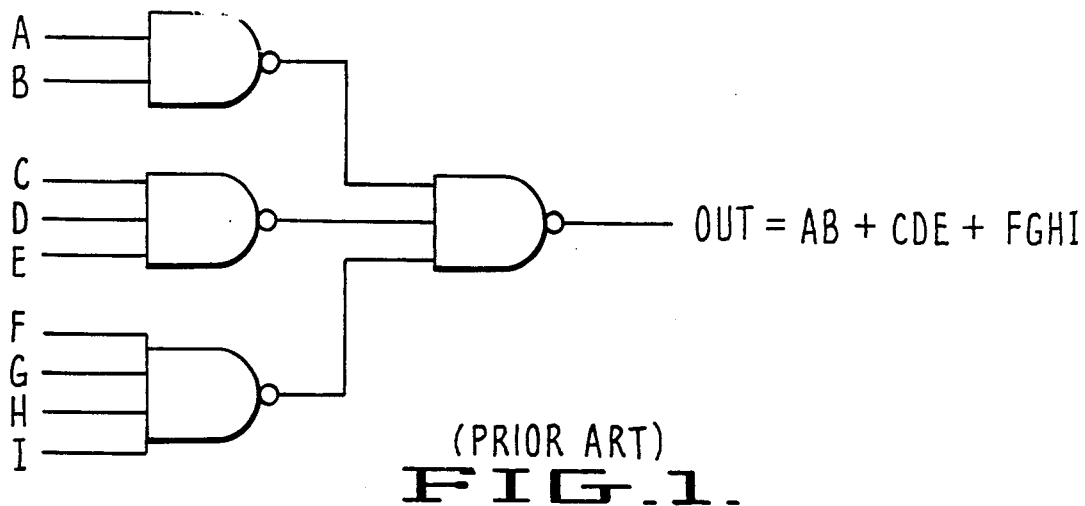
FIG. 1 is a simple logic diagram illustrating a classical NAND-NAND static decoder.
Figure 3:
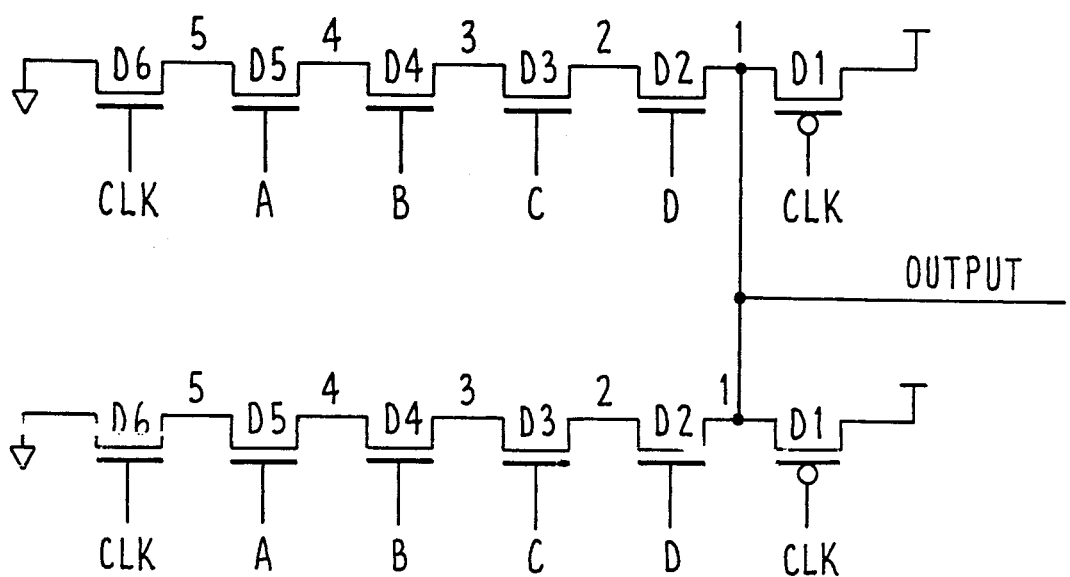
FIG. 3 is a simple schematic diagram illustrating two rows of a dynamic decoder architecture in accordance with the present invention.

FIG. 3 shows two rows of a typical dynamic decoder architecture in accordance with the present invention. Node 1 from each of these rows has been connected to form a single output node. This provides a logical OR function which is commonly referred to as wired-OR. Now the single plane dynamic decoder of the present invention has the same functionality as a two-plane AND-OR functional array, without the second plane, or a static logic gate decoder as shown in FIG. 1.

Figure 4:
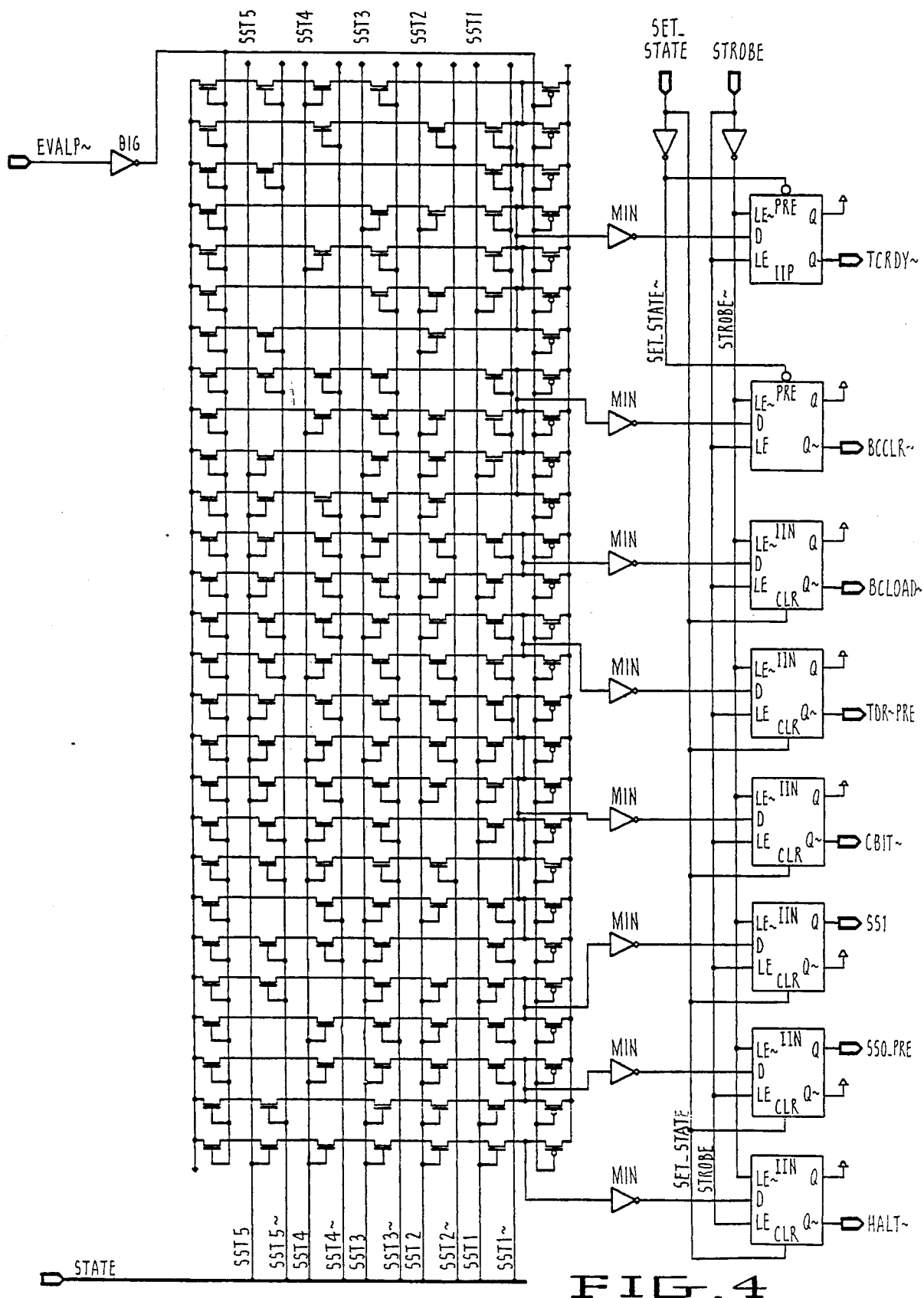
FIG. 4 is a detailed schematic diagram illustrating a multiple-term single plane dynamic decoder in accordance with the present invention.

FIG. 4 provides a detailed schematic diagram showing a typical single plane dynamic decoder in accordance with the present invention. As shown in FIG. 4, each of the outputs from the single plane dynamic decoder is inverted for buffering and latched for multiphase clock operation. Thus, the previous results are made available while new data is clocked in, for a savings of one clock state.

It should be understood that the invention is not intended to be limited by the specifics of the above-described embodiment, but rather defined by the accompanying claims.

What is claimed is:

1. A single plane dynamic decoder for applying a logical expression to a plurality of input signals to produce an "on" or "off" state at defined output nodes, the decoder comprising a number of rows wherein a typical row comprises
   (a) means connected between a first potential and a first node for charging the first node;
   (b) means connected between a second potential and a second node for discharging the second node; and
   (c) a plurality of series-connected switches connected between the first node and the second node and defining intermediate nodes at their respective interconnections, each of the switches being connected to receive a corresponding one of the input signals such that the switches are enabled or disabled thereby,
the charging means being connected to receive a clock signal such that the charging means is enabled by a first clock phase and is disabled by a second clock phase, the discharging means being connected to receive the clock signal such that the discharging means is enabled by the second clock phase and disabled by the first clock phase, whereby the first node is precharged to the "on" state when the charging means is enabled and the second node is discharged to the "off" state when the discharging means is enabled.

2. A single plane dynamic decoder as in claim 1 wherein the first output node of each of a number of rows are commonly connected to provide a single output in a wired-OR configuration.

3. A single plane dynamic decoder for applying a logical expression to a plurality of input signals to produce an "on" or "off" state at defined output nodes, the decoder comprising a number of rows of series-connected MOSFET transistors wherein a typical row comprises a first MOSFET transistor connected between a positive potential and a first node, a second MOSFET transistor connected between ground potential and a second node, a plurality of series-connected MOSFET intermediate transistors connected between the first node and the second node and defining additional nodes at their respective interconnections, each of the gates of the respective intermediate transistors being connected to a corresponding one of the input signals such that the intermediate transistors are enabled or disabled thereby, the gate of the first transistor being connected to a clock signal such that the first transistor is enabled by a first clock state and disabled by a second clock state, the second transistor being connected to the clock signal such that the second device is enabled by the second clock state and disabled by the first clock state, whereby the first node is precharged to the "on" state when the first transistor is enabled and the second node is discharged to the "off" state when the second transistor is enabled.

4. A single plane dynamic decoder for applying a logical expression to a plurality of input signals to produce an "on" or "off" state at defined output nodes, the decoder comprising a number of rows of series-connected MOSFET transistors wherein a typical row comprises a first P-channel MOSFET transistor connected between a positive potential and a first node, a second N-channel MOSFET transistor connected between the ground potential and a second node, a plurality of series-connected N-channel MOSFET devices connected between the first node and the second node and defining additional nodes at their respective interconnections, the gates of the additional N-channel MOSFET devices being connected to a corresponding input signal such that the additional devices are enabled or disabled thereby, the gate of the first P-channel MOSFET transistor being connected to a clock signal such that the first P-channel MOSFET transistor is enabled by a first clock phase and disabled by a second clock phase, the first N-channel transistor being connected to the clock signal such that the second transistor is enabled by the second clock phase and discharged by the first clock phase whereby the first node is precharged to the "on" state when the first P-channel transistor is enabled and the second node is discharged to the "off" state when the second N-channel transistor is enabled.

5. A single plane dynamic decoder as in claim 2 wherein the first output node of each of a number of adjacent rows are connected to provide a single output in a wired-or configuration.

* * * * *